United States Patent
Huh et al.

[11] Patent Number: 5,948,173
[45] Date of Patent: *Sep. 7, 1999

[54] SYSTEM AND METHOD FOR CLEANING A SEMICONDUCTOR WAFER

[75] Inventors: Yun Jun Huh; Suk Bin Han; Jae Jeong Kim, all of Chungcheongbuk-do, Rep. of Korea

[73] Assignee: LG Semicon Co., Ltd., Chungcheongbuk-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/699,865

[22] Filed: Aug. 20, 1996

[30] Foreign Application Priority Data

Apr. 12, 1996 [KR] Rep. of Korea ....................... 96-11060

[51] Int. Cl.$^6$ ....................................... B08B 3/00
[52] U.S. Cl. ............... 134/34; 134/2; 134/25.1; 134/182; 134/186; 134/902
[58] Field of Search ................................. 134/902, 186, 134/2, 10, 18, 34, 25.1, 182

[56] References Cited

U.S. PATENT DOCUMENTS

| | | |
|---|---|---|
| 4,633,893 | 1/1987 | McConnell et al. . |
| 4,899,767 | 2/1990 | McConnell et al. .................. 134/56 R |
| 4,955,402 | 9/1990 | Miranda ............................... 134/186 X |
| 5,292,373 | 3/1994 | Arita et al. . |
| 5,571,367 | 11/1996 | Nakajime et al. ....................... 156/345 |

*Primary Examiner*—Jill Warden
*Assistant Examiner*—Alexander Markoff

[57] ABSTRACT

A system and method for cleaning semiconductor wafers, includes an internal cleaning tank having an outlet and a cassette for holding wafers, and a device disposed near the outlet of the internal cleaning tank for releasing a cleaning solution so as to increase a flow rate of the cleaning solution by creating a spiral flow of the cleaning solution, an external cleaning tank having an intake through which the cleaning solution is supplied to clean the wafers in the internal cleaning tank, a circulating pipe for connecting the outlet to the intake, a circulating pump formed in the middle section of the circulating pipe to repeatedly circulate that cleaning solution, and a filter for filtering the used cleaning solution circulated by the circulating pump to return the cleaning solution to the internal cleaning tank through the intake. The device prevents contaminating materials from adhering to the semiconductor wafers by spirally drawing out the used cleaning solution from the internal tank.

18 Claims, 3 Drawing Sheets

SYSTEM AND METHOD FOR CLEANING A SEMICONDUCTOR WAFER

BACKGROUND OF THE INVENTION

The present invention relates to a cleaning system used in semiconductor fabrication processes. More particularly, it relates to a system for cleaning a semiconductor wafer which makes a drainage of a cleaning liquid more efficient.

In line with the progress in operations for manufacturing semiconductor devices using high integration technology, particulate dust remaining on the surface of a wafer adversely affects the characteristics of the semiconductor devices. Accordingly, a better technique for cleaning semiconductor wafers by which particulate dust can be removed from the surface of the wafers is needed in the semiconductor fabrication processes.

Semiconductor devices having a pattern size of about 0.5 $\mu$m are now mass-produced, using the current ultra large-scale integration technology, and the process for fabricating such microscopic devices requires a dust-free production environment, not to mention surface treatment and cleaning techniques. In particular, according to the trend toward increasing the wafer size and decreasing the chip size, continuous researches have been devoted to develop a bath system using a wet process.

The following description with reference to the attached drawings relates to a conventional wafer cleaning technique.

FIGS. 1A and 1B are schematic views of a conventional system for cleaning semiconductor wafers.

FIG. 1A depicts an overflowing bath system including an internal cleaning tank 1 having an intake 3 through which a cleaning solution is supplied toward the center of the lower section thereof, an external cleaning tank 2 designed to enclose the internal cleaning tank 1 and having an outlet 4 used to release the used cleaning solution to a space separated from the internal cleaning tank 1, and a circulating pipe 10 through which the outlet 4 is connected to the intake 3. The overflowing bath system also includes a circulating pump 5 formed in the middle section of the circulating pipe 10 and used to circulate the cleaning solution repeatedly, and a filter 6 which percolates or filters the cleaning solution repeatedly circulated by the circulating pump 5 and returns the filtered cleaning solution to the internal cleaning tank 1 through the intake 3.

The operation of the overflowing bath system is described as follows.

The operation of the overflowing bath system begins with passing the cleaning solution through the filter 6 using the circulating pump 5. The cleaning solution is then provided to the internal cleaning tank 1 through the intake 3. Wafers 8 mounted on a cassette 7 are then soaked in the cleaning solution. Particulate dust adhered to the surfaces of the wafers 8 is removed by the cleaning solution circulating between the wafers 8.

That is, cleaning and etching processes are performed by the movement of cleaning solution and chemical reaction between the cleaning solution and the wafers 8.

When the cleaning solution starts to overflow after completely filling the internal cleaning tank 1, the cleaning solution passes through the outlet 4 of the external cleaning tank 2 and is filtered through the filter 6 by the circulating pump 5. The cleaning solution percolated by the filter 6 then returns to the internal cleaning tank 1 wherein the wafers 8 are mounted. After that, the cleaning solution may circulate repeatedly or may be dumped into a waste barrel based on a predetermined standard. In other words, when the circulating pump 5 is driven, a waste valve 11 is closed, and when the cleaning solution is to be dumped into a waste barrel, the waste valve 11 is opened to release the used cleaning solution to outside.

FIG. 1B depicts a downflowing bath system including an internal cleaning tank 100 having an outlet 40 used to release the used cleaning solution through the center lower section thereof, an external cleaning tank 200 designed to contain the internal cleaning tank 100 and having an intake 300 through which a cleaning solution is supplied to a space separated from the internal cleaning tank 100, and a circulating pipe 101 through which the outlet 40 is connected to the intake 300. The downflowing bath system also includes a circulating pump 50 formed in the middle section of the circulating pipe 101 and used to circulate the cleaning solution repeatedly, a filter 60 which filters the cleaning solution circulated by the circulating pump 50 and returns the filtered cleaning solution to the internal cleaning tank 100 through the intake 300, and a baffle plate 90 formed in the lower section of the internal cleaning tank 100 for separating a cassette 70 containing wafers 80 from the bottom of the internal cleaning tank 100.

The operation of the downflowing bath system is described as follows.

The operation of the downflowing bath system begins with passing the cleaning solution through the filter 60 using the circulating pump 50. The cleaning solution is then provided to the internal cleaning tank 100 through the intake 300. The cleaning solution flows into the tank 100 from the above and fills the tank 100. The cassette 70 containing the wafers 80 is fixed to the baffle plate 90 of the internal cleaning tank 100, and is soaked in the cleaning solution. The wafers 80 mounted on the cassette 70 are washed by the circulating cleaning solution. Then the cleaning solution passes through the baffle plate 90 and is percolated through the filter 60. The percolated cleaning solution is continuously circulated by the circulating pump 50. When the circulating pump 50 of the downflowing bath system is driven, a waste valve 51 is closed, and when the used cleaning solution is to be dumped into a waste barrel according to a predetermined standard, the waste valve 51 is opened to release the used cleaning solution to outside.

Such conventional cleaning systems have the following disadvantageous aspects.

According to the overflowing bath system having the intake in the lower section of the internal cleaning tank, the cleaning solution flows upwardly which causes the particulate dust remaining on the portions of the cassette supporting the wafers to migrate upwardly. Thus, the dust may again spread over the frontside or backside of the wafers or cause a chemical reaction to contaminate the surfaces of the wafers, because such a contamination source (e.g., the particulate dust) is positioned near the intake and the cleaning solution passes through the intake and then the contamination source to reach the wafers.

On the other hand, in the downflowing bath system, since the cleaning solution streams substantially straight, the contaminant dust is not completely removed from the portions of the wafers supported by the cassette, but is spread among the wafers during the cleaning process to migrate to the frontside or backside of the wafers or to the baffle plate. Therefore, it is difficult to effectively and completely remove the dust contaminating the surfaces of the wafers by using the above-mentioned conventional cleaning systems.

Moreover, if subsequent processes are carried out, such a condition where the cleaning process for the wafers is imperfectly performed deteriorates processing efficiency and the characteristics of semiconductor devices.

SUMMARY OF THE INVENTION

Accordingly, it is an objective of the present invention to provide a system and method for cleaning a semiconductor wafer which makes an efficient drainage of a cleaning solution according to a predetermined standard in a cleaning process, thereby enhancing the cleaning capability of the cleaning solution.

In order to realize the above objective, a system and method for cleaning a semiconductor wafer in accordance with the embodiments of the present invention includes cleaning tanks having an intake and an outlet for a cleaning solution to flow through and wafers to be cleaned, and a device being mounted on the outlet for releasing the cleaning solution by generating a spiral flow of the cleaning solution so as to increase a flow rate of the cleaning solution and remove dust near or on the wafer.

More specifically, the inventive system for cleaning a semiconductor wafer includes an internal cleaning tank having an outlet for a cleaning solution to flow through and a cassette for holding semiconductor wafers; a device for releasing the cleaning solution through the outlet to increase a flow rate of the cleaning solution; an external cleaning tank having a space separated from the internal cleaning tank and an intake through which the cleaning solution is supplied to the internal cleaning tank to clean the semiconductor wafers; a circulating pipe connecting the outlet and the intake; a circulating pump formed in the middle section of the circulating pipe to repeatedly circulate the cleaning solution; a filter for filtering the cleaning solution circulated by the circulating pump to return the filtered cleaning solution to the internal cleaning tank through the intake; and a baffle plate formed on the bottom of the internal cleaning tank to fix the cassette holding the semiconductor wafers and separate it from the bottom of the internal cleaning tank.

Briefly described, the present invention is directed to a system for cleaning semiconductor wafers, including cleaning tank, means for cleaning semiconductor wafer disposed therein, having an intake and an outlet for moving a cleaning solution therethrough, and releasing means connected to the outlet of the cleaning tank means for applying rotation movements to the cleaning solution so as to control a flow rate of the cleaning solution.

Furthermore, the present invention is directed to a method of cleaning at least one semiconductor wafer, including the steps of cleaning the semiconductor wafer disposed in a first tank using a cleaning solution, and applying rotation movement to the used cleaning solution so as to control a flow rate of the cleaning solution.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and, thus, are not limitative of the present invention, and wherein.

DETAILED DESCRIPTION OF PREFERRED EMBODIMENTS

Hereinafter, a preferred embodiment of the present invention will be described in detail with reference to the accompanying drawings.

Figure 1A:
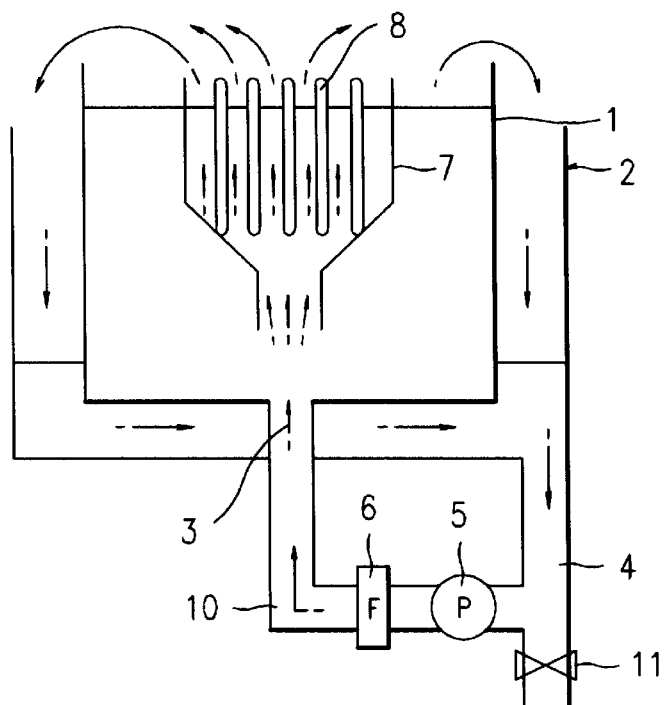
FIGS. 1A and 1B are schematic views of a conventional system for cleaning a semiconductor wafer.
Figure 1B:
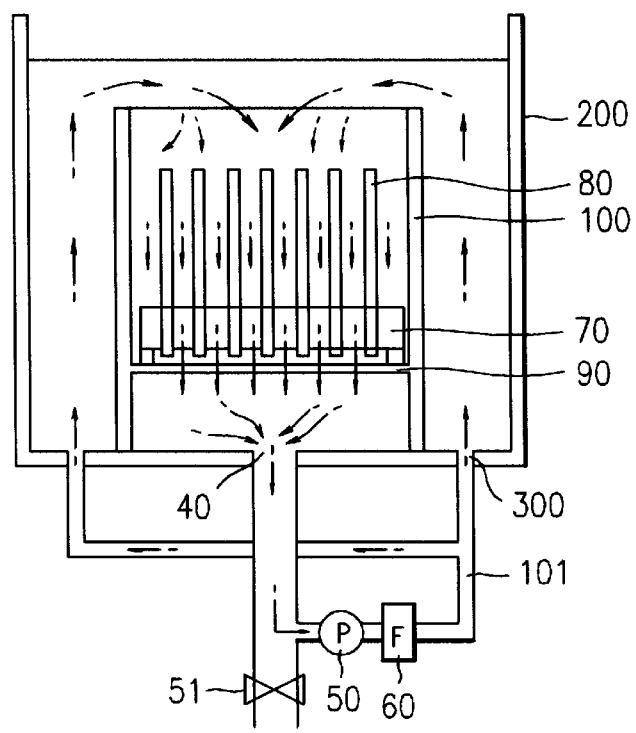
Figure 2:
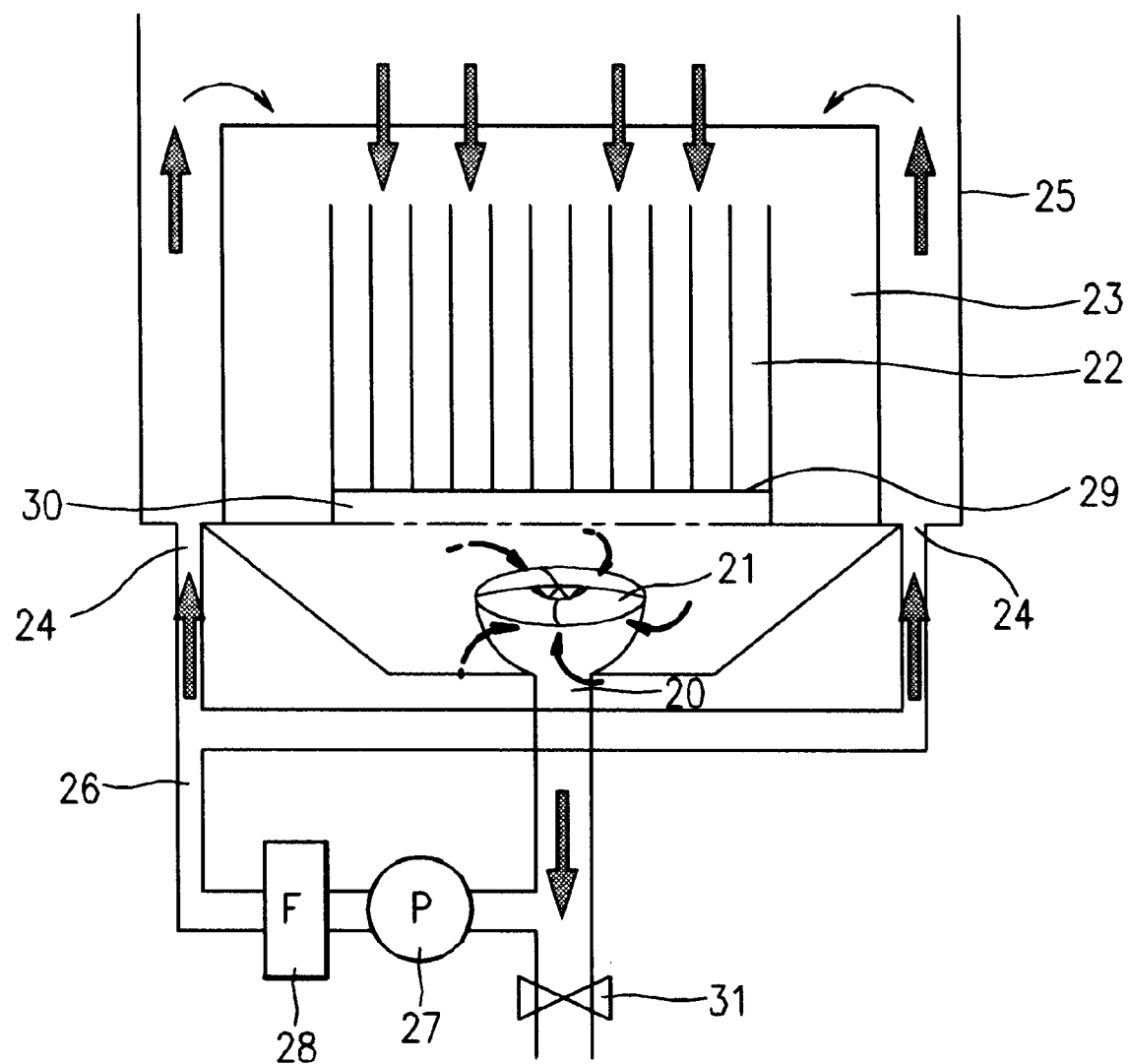
FIG. 2 is a schematic view of a system for cleaning semiconductor wafers in accordance with the embodiments of the present invention.
Figure 3:
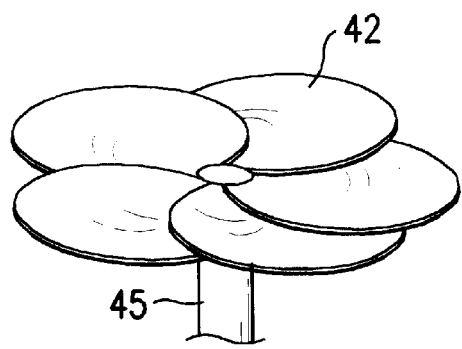
FIG. 3 is a device for releasing a cleaning solution in accordance with a first preferred embodiment of the present invention.

FIG. 2 is a schematic view of a system for cleaning a semiconductor wafer according to the present invention, and FIG. 3 depicts a device for releasing a cleaning solution or washing liquid in accordance with a first preferred embodiment of the present invention.

Although the system for cleaning a semiconductor wafer in accordance with the present invention adopts a down-flowing system, the inventive concepts and advantages can be implemented in an overflowing system. The system according to the embodiments of the present invention includes a device for releasing a cleaning solution that creates a spiral flow of a cleaning solution released from an outlet when the cleaning solution circulates or is dumped into a waste vessel.

As shown in FIG. 2, the system for cleaning a semiconductor wafer in accordance with the present invention includes a device 21 for creating a spiral flow of the cleaning solution by operating the device 21 electrically, e.g., using a motor or in response to a flow of the cleaning solution enhanced by a circulating pump 27, an internal cleaning tank 23 having an outlet 20 formed in the center portion of the lower section thereof, and an external cleaning tank 25 formed to enclose the internal cleaning tank 23 and having intakes 24 through which the cleaning solution flows to a space separated from the internal cleaning tank 33.

The cleaning system of the present invention also includes a circulating pipe 26 through which the intakes 24 and outlet 20 are connected to each other, the circulating pump 27 mounted in the middle section of the circulating pipe 26 to repeatedly circulate the cleaning solution, a filter 28 that percolates or filters the cleaning solution repeatedly circulated by the circulating pump 27 to return the filtered cleaning solution to the internal cleaning tank 23 through the intakes 24, and a baffle plate 30 formed on the bottom of the internal cleaning tank 23 to fix a cassette 29 containing wafers 22 and to separate the cassette from the bottom of the internal cleaning tank 23.

A cleaning process performed by the cleaning system of the present invention is described as follows. The cleaning process by the system of the present invention starts off by passing the cleaning solution through the filter 28 using the circulating pump 27 to fill the internal cleaning tank 23 through the intakes 24. The cleaning solution fills the tank 23 from the above. The cassette 29 containing the wafers 22 is fixed to the baffle plate 30 of the internal cleaning tank 23, and is soaked in the cleaning water. The wafers 22 mounted on the cassette 29 are washed by the flowing cleaning solution. The cleaning solution is then filtered through the filter 28 and continuously circulated by the circulating pump 27, in which case a waste valve 31 remains closed. The releasing device 21 positioned at a bottom portion of the tank 23 near the outlet 20 generates rotating movements, causing the cleaning solution to quickly pass through the baffle plate 30 and agitating the cleaning solution in spiral form so that the flow rate of the cleaning solution at the outlet 20 is increased. As a result, this system can prevent contaminating dusts remaining on or near the portions of the wafers supported by the cassette from adhering to the surface of the wafers.

As shown in FIG. 3, the releasing device 21 has a vane shaped fan 42 for controlling a flow rate of the cleaning solution, and a pivot 45 fixed to the center portion of the fan 42 to be rotatably connected to a predetermined portion of the circulating pipe 26.

Figure 4:
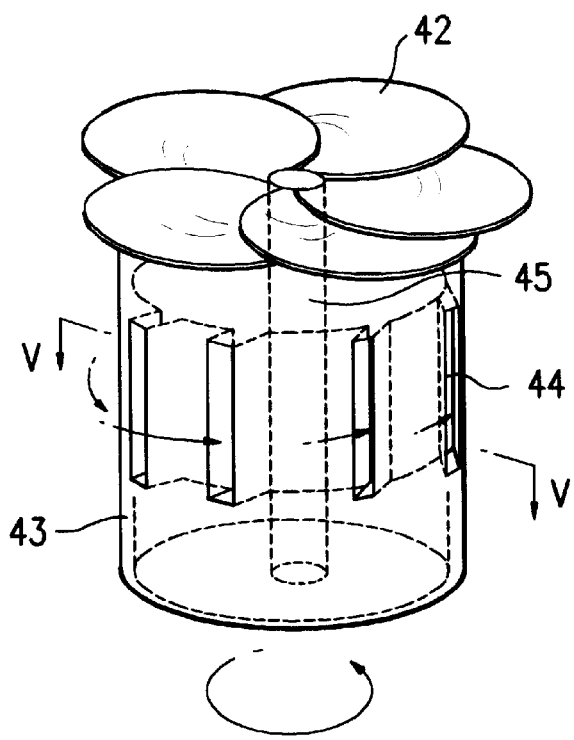
FIG. 4 is a device for releasing a cleaning solution in accordance with a second preferred embodiment of the present invention.
Figure 5:
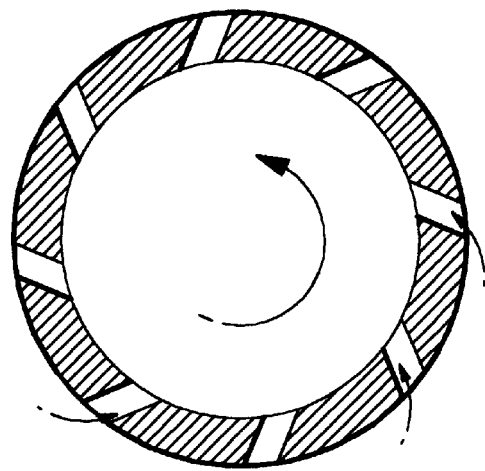
FIG. 5 is a sectional view, taken along line A—A of FIG. 4.

FIGS. 4 and 5 depict a device for releasing a cleaning solution in accordance with a second preferred embodiment.

This device for releasing a cleaning solution has a vane-shaped fan 42 for controlling a flow rate of the cleaning solution, a rotary part 43 integrally formed with the fan and having a plurality of inlets 44 formed at certain angles and spaced from each other at regular intervals for receiving the cleaning solution therethrough, as shown in FIG. 5, for example, and a pivot 45 connected to the fan 42 through the inside of the rotary part 43. FIG. 5 shows each inlet 44 inclined at about 45° from the tangential line of each inlet 44. The rotary part 43 is rotatably fixed to a portion (e.g. the outlet 20) of the circulating pipe 21, so that the cleaning solution enters through the plurality of inlets 44 to flow through the circulating pipe 26.

Each part of the device as shown in FIGS. 3 and 4 for releasing a cleaning solution is made from a material that does not react to the cleaning solution.

The rotating speed of the releasing device is controlled not to break the state of the wafers supported by the cassette and not to deteriorate the downflow wafer-cleaning capability.

The system for cleaning a semiconductor wafer in accordance with the present invention allows the flow of the cleaning solution to be changed into a spiral form from a straight one, and contaminations remaining on the portions of the wafers supported by the cassette, on the cleaning tank's bottom surface, and near the outlet can be efficiently removed to more completely eliminate contaminant dusts from the surface of the wafers.

The preferred embodiments of the present invention are given by way of example, and the invention recited in the attached claims is not limited to the illustrative embodiments. Those of ordinary skill in the art will recognize that routine design changes may be made to the exemplary embodiments without departing from the scope of the claims.

What is claimed is:

1. A system for cleaning a semiconductor wafer, comprising:

cleaning tank means for cleaning at least one semiconductor wafer disposed therein, the cleaning tank means having an intake and an outlet for moving a cleaning solution; and releasing means disposed adjacent the outlet of the cleaning tank means for applying rotation movements to the cleaning solution exiting the cleaning tank means, so as to prevent adherence of contaminating materials onto the semiconductor wafer, wherein the releasing means includes,
a rotating member for generating the rotation movements to the cleaning solution, and
a pivot member for supporting the rotating member, the rotating member including a plurality of circular members attached to the pivot member.

2. A system according to claim 1, wherein the rotating member is a vane-shaped fan.

3. A system according to claim 1, wherein the rotating member rotates in one direction by an operation of a motor.

4. A system according to claim 1, wherein the releasing means further includes:

a rotary part connected to the rotating member for rotating with the rotating member, the rotary part having a plurality of inlets for receiving the cleaning solution therethrough.

5. A system according to claim 4, wherein the rotary part has a substantially cylindrical body and a hollow inside for receiving and cleaning solution through the plurality of inlets.

6. A system according to claim 1, wherein the cleaning tank means includes:

an internal tank having the outlet and a cassette for holding the semiconductor wafer, an external tank having the intake and surrounding the internal tank for supplying the cleaning solution to the internal tank, and a baffle plate for supporting the cassette, the baffle plate being disposed above the rotating member.

7. A system according to claim 6, further comprising:

a circulating pipe connected to the intake and outlet of the cleaning tank means;

a circulating pump connected to the circulating pipe to repeatedly circulate the cleaning solution;

a filter for filtering the cleaning solution circulated by the circulating pump; and a waste valve being closed to circulate the cleaning solution and being opened to output the cleaning solution.

8. A method of cleaning at least one semiconductor wafer, comprising the steps of:

cleaning the semiconductor wafer disposed in an internal tank using a cleaning solution; and applying rotation movement to the used cleaning solution exiting internal tank, so as to prevent adherence of contaminating materials onto the semiconductor wafer, wherein the applying step includes the steps of,
generating the rotation movement using a rotatable fan member disposed adjacent an outlet of the internal tank and using a pivot member supporting the rotatable fan member, and
flowing the cleaning solution into a rotary part connected with the rotatable fan member and through a circulating pipe used to circulate the cleaning solution back to the internal tank.

9. A method according to claim 8, wherein the rotation movement causes a spiral flow of the cleaning solution, the rotatable fan member including a plurality of circular members attached to the pivot member, the circular members at least partially surrounding an end of the pivot member.

10. A method according to claim 8, wherein the fan member is actuated electrically.

11. A method according to claim 8, wherein the rotary part has a substantially cylindrical body, a hollow iside, and a plurality of inlets formed through the cylindrical body for passing the cleaning solution therethrough.

12. A system according to claim 1, wherein the pivot member directly contacts an edge portion of each of the circular members.

13. A system according to claim 1, wherein the circular members overlap each other and at least partially surround an end portion of the pivot member.

14. A system according to claim 4, wherein each of the inlets have a substantially rectangular shape.

15. A system according to claim 4, wherein each of the inlets are disposed at approximately 45° with respect to a tangential line of said each inlet, said tangential line referring to a line substantially tangent to a portion of the rotary part having a corresponding inlet therein.

16. A method according to claim 8, wherein each of the inlets are disposed at approximately 45° with respect to a tangential line of said each inlet, said tangential line referring to a line substantially tangent to a portion of the rotary part having a corresponding inlet therein.

17. A system for cleaning a semiconductor wafer, comprising:

cleaning tank means for cleaning at least one semiconductor wafer disposed therein, the cleaning tank means having an intake and an outlet for moving a cleaning solution; and releasing means disposed adjacent the outlet of the cleaning tank means for applying rotation movement to the cleaning solution existing the cleaning tank means, wherein the releasing means includes, a rotating member for generating the rotation movement to the cleaning solution, a pivot member for supporting the rotating member, and a rotary part connected to the rotating member for rotating with the rotating member, the rotary part having a plurality of inlets for receiving the cleaning solution therethrough.

18. A method of cleaning at least one semiconductor wafer, comprising the steps of:

cleaning the semiconductor wafer disposed in an internal tank using a cleaning solution; and applying rotation movement to the used cleaning solution exiting the internal tank, so as to prevent adherence of contaminating materials onto the semiconductor wafer, wherein the applying step includes generating the rotation movement using a rotatable fan member disposed adjacent an outlet of the internal tank and using a pivot member supporting the rotatable fan member, wherein the rotation movement causes a spiral flow of the cleaning solution, the rotatable fan member including a plurality of circular members attached to the pivot member, the circular members at least partially surrounding an end portion of the pivot member.

* * * * *